United States Patent [19]

Gold

[11] 4,066,953
[45] Jan. 3, 1978

[54] COMBINATION HIGH IMPEDANCE CONTINUITY AND VOLTAGE INDICATING INSTRUMENT

[75] Inventor: Charles Gold, Hallandale, Fla.

[73] Assignee: Lawrence Gold, Berkeley, Calif.; a part interest

[21] Appl. No.: 738,443

[22] Filed: Nov. 3, 1976

Related U.S. Application Data

[63] Continuation of Ser. No. 512,191, Oct. 7, 1974.

[51] Int. Cl.$^2$ .................... G01R 1/30; G01R 31/02
[52] U.S. Cl. .................... 324/123 R; 324/51; 324/60 C; 324/62; 324/133; 324/149
[58] Field of Search ........... 324/51, 53, 60 C, 60 CD, 324/72.5, 62, 123 R, 123 C, 133, 149; 307/308

[56] References Cited

U.S. PATENT DOCUMENTS

| | | | |
|---|---|---|---|
| 3,328,684 | 6/1967 | Dorris | 324/51 |
| 3,412,327 | 11/1968 | Murray | 324/72.5 |
| 3,437,928 | 4/1969 | Baker et al. | 324/133 |

FOREIGN PATENT DOCUMENTS 1,236,403   6/1960   France .................... 324/51

Primary Examiner—James B. Mullins
Attorney, Agent, or Firm—Warren, Chickering & Grunewald

[57] ABSTRACT

An electrical testing instrument including an amplifier circuit having a pair of inputs, one comprising a probe and the other being adapted for manual engagement by the user for completing an input circuit through the body of the user. The circuit has a battery and a current-responsive indicator in its output circuit to provide a signal when current flows in the input circuit to provide a critical forward biasing of the amplifier. The battery is connected to furnish such input current when the input terminals are connected in a closed circuit having a resistance of at least approximately the resistance of the user's body. The amplifier circuit is further arranged that when the probe is contacted with a live AC power line and the manually engageable input terminal is so manually engaged, an operating indicating current will also be present in the output circuit.

3 Claims, 5 Drawing Figures

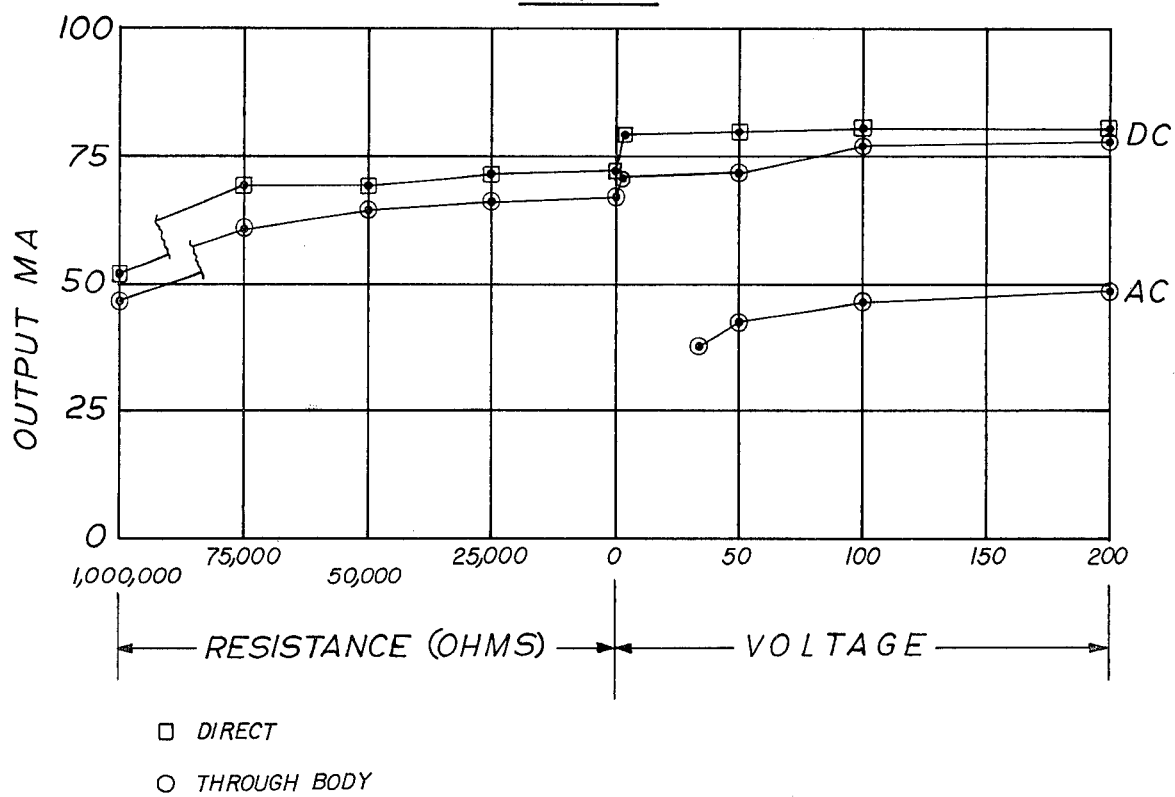

COMBINATION HIGH IMPEDANCE CONTINUITY AND VOLTAGE INDICATING INSTRUMENT

This is a continuation of application Ser. No. 512,191 filed October 7, 1974.

BACKGROUND OF THE INVENTION

1. Field of Invention

The invention relates to instruments used by electricians and electronic technicians for indicating the presence or absence of continuity, or the presence or absence of an electrical potential in an electric circuit. An example of a continuity tester is the usual ohm meter, and examples of voltage-indicating devices are the usual neon tester and voltmeter.

2. Description of Prior Art

The ohm meter may most simply consist of a battery in series with a current-reading meter and which is connected in series with the electrical path whose continuity is to be checked. Another commonly used continuity tester may consist simply of a battery in series with a lamp bulb where a quantitative resistance determination is not required.

The common voltage sensing instruments above noted are not usable by themselves and without further implementation for sensing continuity in electric circuits; and similarly, the continuity testers in common use by electricians and technicians are not usable by themselves and without further implementation for determining the presence of an electrical potential. These two types of instruments are perhaps the most universally used by electricians and technicians and a single compact, portable and easily carried unit for performing both of these diverse functions would be most useful.

Certain more sophisticated instruments using solid-state amplifiers have been designed for specific applications, principally low resistance sensing, see U.S. Pat. Nos. 3,283,244 and 3,328,684; British Pat. No. 910,045/1962; and French Pat. No. 1,236,403/1960. These specialized testers have been designed for sensing and indicating very low resistance from just a few ohms to a few thousand ohms; have no use as a continuity tester in circuits having much higher resistance, e.g. up to one megohm or more; and cannot be used for any practical voltage sensing, at least in the higher ranges of voltage normally encountered by the electrician or technician.

SUMMARY OF INVENTION

An object of the present invention is to provide a small, compact; and readily carried test instrument of the character described, having a universal use and application in sensing;

a. extremely small current, as low as one microampere or less;

b. a resistance range from 0 to 1 megohm or more;

c. electrical leakage from a power line to the fram or casing or a machine or equipment, even when the leakage resistance is very great, e.g. up to 50 megohms or more;

d. the aforementioned leakage current in the case of AC power without the requirement of a separate instrument grounding lead;

e. of the presence of AC power at wall outlets, fuses, circuit breakers and the like, again without use of a separate instrument grounding lead;

f. of leakage, shorts, and approximate capacitance of capacitors; and g. presence and polarity of DC power over the usual range of batteries and voltages most frequently encountered in electronic circuits.

The present instrument is designed to be hand-held, with one hand of the user engaging the case of the unit, which provides one of the input leads so as to normally, although not necessarily, place the body of the user in series with the circuit being tested. The instrument is provided with a test probe which in normal use provides the second input terminal for the tester. Thus no separate leads, clips, or external wires are normally involved in the use of the tester. The interposing of the user's body in the input circuit of the tester adds a high input resistance to the input circuit. The latter, i.e. input circuit, is additionally provided with a relatively high input resistor which serves as a protective device for the transistors in the amplifying circuit and also cofunctions with the body resistance of the user to reduce the input current in all instances to a very small value, thus assuring complete safety to the user as well as to the internal, sensitive, solid-state devices. The very small operating input current, for example, will enable the continuity testing of very sensitive devices such as flashbulbs without danger of ignition. Similarly, the hand-held instrument of the present invention may be used with complete safety to the user, as well as the instrument, in testing AC power line connections, even though the body of the user is grounded.

The invention possesses other objects and features of advantage, some of which of the foregoing will be set forth in the following description of the preferred form of the invention which is illustrated in the drawings accompanying and forming part of this specification. It is to be understood, however, that variations in the showing made by the said drawings and description may be adopted within the scope of the invention as set forth in the claims.

BRIEF DESCRIPTION OF DRAWINGS

FIG. 5 is a chart showing operating characteristics of the tester under various conditions of use.

DETAILED DESCRIPTION OF INVENTION

Figure 1:
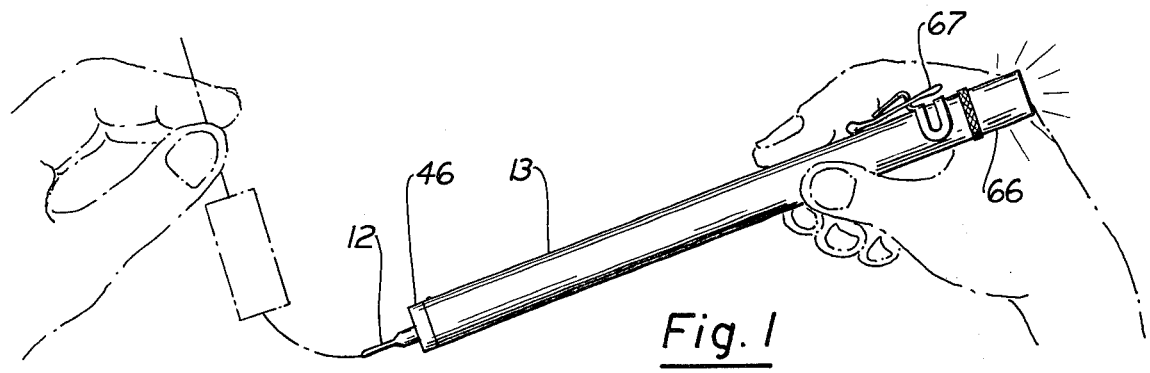
FIG. 1 is a side elevation of a combination continuity and voltage tester constructed in accordance with the present invention and depicted in use.

The electrical testing instrument of the present invention comprises, briefly, an amplifier circuit 11 having a pair of input terminals, terminal 12 being a probe and terminal 13 comprising an elongated metal case adapted for manual engagement by the user for completing an input circuit through the body of the user, the amplifier also having an output circuit 14; a battery 16; and a current-responsive indicator 17 connected in output circuit 14, indicator 17 providing a manually discernible signal at and above an operating current flow, and the amplifier circuit providing such current flow in the output circuit when the input circuit 18 is biased in a forward direction at and above a critical bias current; battery 16 being connected to furnish such critical forward bias current when input terminals 12 and 13 are connected in a closed circuit having a resistance at least approximately the resistance of the user's body; and the amplifier circuit being so constructed that when probe 12 is connected to a live terminal 21 of a power line 22 providing approximately 110 volts AC and input terminal 13 is manually engaged, the AC potential will provide the aforementioned critical forward bias current.

In order to adapt the instrument to its various conditions of use, as more fully discussed herein, amplifier circuit 11 should have a gain of at least about 25,000 and, preferably, in the range of about 25,000 to about 60,000. Such an amplifier may comprise a Darlington pair, as here illustrated, or one or more field-effect transistors (FETS), metal oxide semi-conductor field-effect transistors (MOSFETS), or an integrated circuit amplifier. Also, to protect the solid-state devices, an input resistor 20 is inserted in the input circuit and preferably has a resistance of about 50,000 ohms. As here shown, resistor 20 is connected between probe 12 and the base 26 of a first Darlington transistor 27. The emitter 28 of transistor 27 is connected to the base 29 of a second Darlington transistor 30. Emitter 31 of transistor 30 is connected in output circuit 14 in series with battery 16 and indicator 17, the latter being connected to the collectors 32 and 33 of transistors 28 and 30 to complete the output circuit. The configuration shown is for NPN transistors. PNP transistors may be substituted with a reversal of the battery connections. Preferably, a capacitor 36 is connected across resistor 20 so as to enhance the sensitivity of the instrument when used for indicating the presence of alternating current, energy or power.

Another feature of the present invention is that the input terminal 13 is connected to output circuit 14, specifically at collectors 32 and 33, so as to provide a feedback of energy from battery 16 to the input circuit for inducing the forward bias as above discussed. Importantly, and as will be noted for FIGS. 3 and 4, the feedback connection to terminal 13 is taken at the side of indicator 17 opposite to the side of the indicator which is connected to battery 16. Accordingly, as current is drawn in the input circuit, a voltage drop will occur across indicator 17, thus providing a self-regulating function.

Various types of indicators may be used, such as incandescent lamp bulbs, light-emitting diodes, buzzers and the like. Of these, a small incandescent filament bulb is preferred. A nominally 60-milli-ampere incandescent bulb, rated at 2 volts, has been found to provide excellent visual signal qualities over a substantially unlimited life. This bulb will stand temporary overloads up to 80 milli-amperes and more without failure and will provide a clear visual signal down to about 35 milli-amps. Battery 16 here provides about 4.5 volts DC, which may be readily obtained by three small dry cells 41, 42 and 43, connected end to end as seen in FIG. 2.

Figure 2:
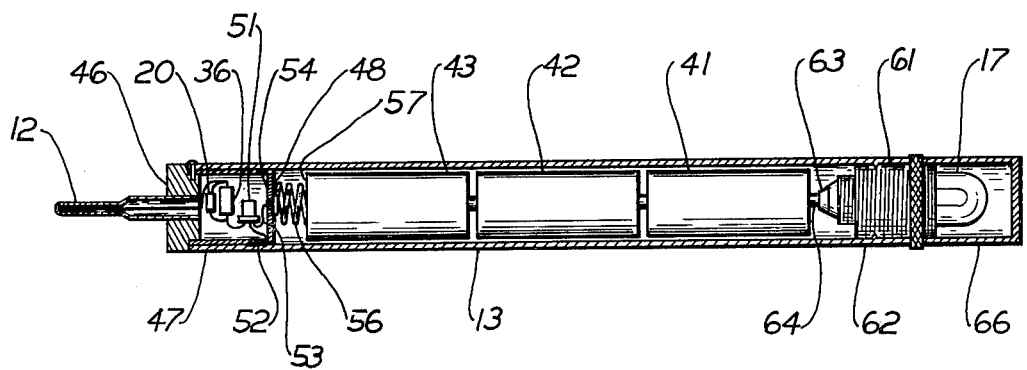
FIG. 2 is a longitudinal cross-sectional view of the instrument.

The instrument may be assembled, as seen in FIGS. 1 and 2, in a small, compact, elongated form for pocket mounting, carrying and handling in much the same manner as a fountain pen or pencil. The main body comprises an elongated tubular metal case 13 which may be formed of aluminum or other sturdy, lightweight and current-conducting material. Probe 12 is here formed as an elongated metallic contact member, carried by and projecting from an insulator disc 46, here having a pressed fit into and being pinned to one end 47 of case 13. The electronic parts are assembled within a subhousing 48 mounted in tube 13 interiorly of and adjacent to disc 46. Transistors 27 and 30 are illustrated as they appear in their commercially available form in a single envelope 51. A conductor 52 connecting the collectors 32 and 33 is here extended exteriorly of subhousing 48 and into pressure contact with the surrounding metal tube 13. A conductor 53 is taken from transistor 51 and, more specifically, from emitter 31 of transistor 30 and extended through an insulated end wall 54 of subhousing 48 and into contact with one end of a helical spring 56, which engages the negative or bottom side of battery 43 held in compression against the spring. A bulb mount 61 is threaded into the opposite end 62 of case 13 and threadably carries incandescent bulb 17 with its base terminal 63 supported axially within the case for contact with the positive terminal 64 of battery 41. A hollow, cylindrical, open-ended enclosure 66 of translucent plastic is here threaded to bulb mount 61 for enclosing and protecting the outer glass envelope of the bulb. A pocket-engaging clip 67 is preferably mounted on the case adjacent the bulb for convenient mounting in the pocket of the user in typical pen or pencil fashion. The use of small size batteries such as No. 904, size N standard dry cells, enables the entire instrument to be encapsulated in a most convenient pen-like size and configuration.

Figure 3:
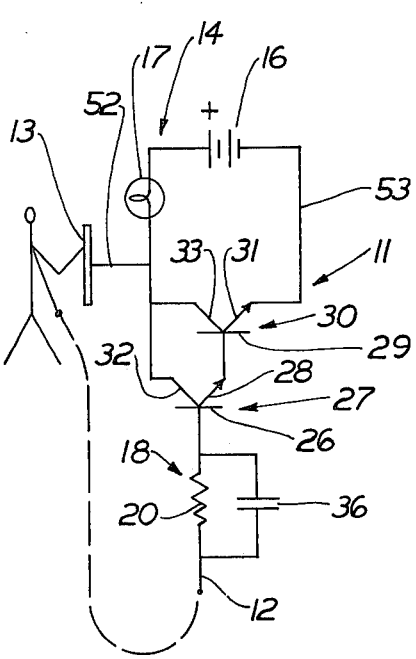
FIG. 3 is an electrical schematic diagram of the tester as used for continuity testing.
Figure 4:
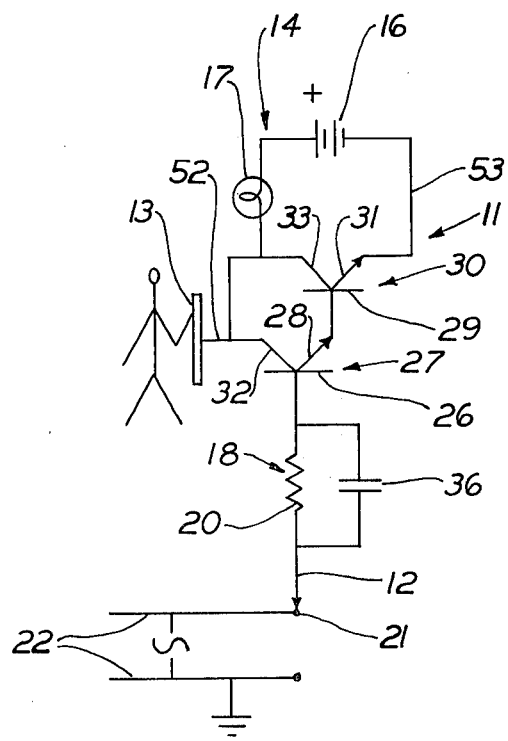
FIG. 4 is an electrical schematic diagram of the tester as used for sensing AC voltage.

When the circuit is used to measure continuity, as depicted in FIG. 3, the maximum current drawn in the input circuit where the external circuit resistance is 0 will be in the order of up to about 2 micro-amperes. Normally, the body of the user will insert a resistance of between 50,000 and 100,000 ohms, depending upon the quality of body contact. As the resistance of the external circuit increases, the input current decreases. For example, for external resistances of 100,000 ohms and 1 megohm, the input current will be about 1.5 micro-amperes and 1 micro-ampere respectively. Where a lead is used to make the connection to the case, rather than taking the current through the body, the input current was found to increase only a fraction of a micro-ampere in each instance. Over these same resistance measurements, it will be noted from FIG. 5 that the output current will vary from about 45 milli-amps to about 70 milli-amps. As voltage is applied to the input circuit, the input current will increase from about 1½ micro-amps at 0 volts to about 40 microamps at 40 volts DC. When checking a live power line for AC voltage, the maximum current in the input circuit will be approximately 30 micro-amperes. In such test, the case 13 is hand-held and the probe 12 contacted with the live AC terminal. No other connection is made to the other hand or body of the user. It has been determined, however, that if the other hand or body of the user makes a good ground contact, the current in the input circuit will only raise to about 1 milli-ampere, which is, of course, entirely safe. When testing for AC power, the output current will increase from about 38 milli-amperes at about 35 volts to about 48 milli-amperes at 200 volts, the AC circuit being opened, with only the test probe 12 connected to the live AC voltage, as depicted in FIG. 4. 35 volts AC is about the lower limit of use of the instrument as here constructed when used in this manner. In testing for the presence of DC volts, where the input current is taken through the body of the user or direct, as by use of a separate lead, the output current holds relatively constant, in the range of about 70-80 milli-amperes over a wide voltage range of about 1.5 volts (the usual single dry cell battery) to about 200 volts. It will be noted that the output current is only slightly higher when the instrument is used direct rather than through the body.

As hereinabove noted, any increase in current through the transistor is accompanied by an increase in current through the bulb and, accordingly, a larger voltage drop at the collector. Since the collector is directly connected to the case, and the case forms one of the input terminals, any voltage drop reflected at the collector is similarly reflected at the input terminal, thus decreasing the bias to the input. Accordingly, it is seen that the circuit is self-regulating.

Another important feature in protecting the bulb against burnout and protecting against too high currents in the output circuit is the fact that the resistance of the bulb filament will increase rapidly with increased current through the filament, thus further and automatically limiting the current flow.

Finally, it will be noted that in the AC-operating mode of the tester, as seen in FIG. 4, the input circuit is essentially open-circuited. There is, nevertheless, a sufficient transfer of radiated energy to the body to cause the requisite, although very small, current flow in the input circuit. Thus the instrument will detect leakage current in power-operated medical and other equipment, and the like, where the leakage current may be extremely small. The instrument has been found effective in measuring such leakage current through leakage resistance of up to 10 megohms or more, which is difficult to measure with ordinary instruments which draw significant current. Leakage current through internal resistance of 40 megohms has been detected. The very small required input current enables the instrument to detect continuity in such delicate devices as flashbulbs without danger of actuating the flashbulb.

Another and important use of the present instrument is in testing capacitors, in the manner illustrated in FIG. 1, for short, open circuit, or leakabe. On making initial contact with the leads of the capacitor, as illustrated in FIG. 1, lamp bulb 17 will light for the period of charging of the capacitor. If the capacitor is in good condition, it will come up to charge, the charging current will cease, and lamp 17 will be extinguished. An observation of the duration of the light indication will furnish an approximation of the size and condition of the capacitor. Failure of the bulb to light would indicate an open circuit or a capacitance smaller than about 0.1 MFD. Failure of the lamp bulb to extinguish after initial lighting indicates a short or leakage. The instrument may also be used for testing polarity of DC circuits, diodes, rectifiers and transistors in forward and reverse directions, by observing the signal, or the lack thereof, of indicator 17.

Finally, it will be observed that all of the uses and tests described herein can be made without the use of any ground leads, clips, or separate wires, the instrument being entirely self-complete in its hand-held position.

The present instrument does not require a switch to open the battery circuit when the instrument is not in use. The transistor current in the non-operating state of the device is so very small as to not significantly impair the shelf life of the battery.

What is claimed is:

1. An electric testing instrument comprising:

an amplifier circuit having a pair of input terminals comprising a probe and a second terminal adapted for manual engagement by the user for completing an input circuit through the body of the user, and an output circuit comprising in series a collector, an emitter, a battery and a current responsive indicator;

said second terminal being connected to the side of said battery connected to said collector and having a polarity opposite to said emitter;

said indicator providing a manually discernible signal at and above an operating current flow in said output circuit, said amplifier having a gain of at least about 25,000 and providing said operating current flow in said output circuit when said input circuit is biased with an input current as low as about 1 microampere;

said input circuit providing said input current derived solely from said battery when said input terminals are connected across a resistance as high as at least 1 megohm, said input circuit providing said input current when said probe is connected to a conventional live power line providing approximately 110 volts AC and said second terminal is manually engaged.

2. An instrument as defined in claim 1;

an input resistor in said input circuit having a resistance of at least about 50,000 ohms; and a capacitor connected in parallel across said input resistor.

3. The instrument of claim 1, said indicator comprising an incandescent bulb filament, and said filament being connected to and between said battery and said second terminal whereby the current flow between said battery and second terminal passes through and is regulated by the resistance change with current provided by said filament.

* * * * *